(12) United States Patent
Christensen et al.

(10) Patent No.: US 7,977,804 B2
(45) Date of Patent: Jul. 12, 2011

(54) BALL-BUMP BONDED RIBBON-WIRE INTERCONNECT

(75) Inventors: Dale E. Christensen, Portland, OR (US); Curtis J. Miller, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 431 days.

(21) Appl. No.: 12/122,213

(22) Filed: May 16, 2008

(65) Prior Publication Data

US 2009/0283920 A1    Nov. 19, 2009

(51) Int. Cl.
*H01L 23/488* (2006.01)
(52) U.S. Cl. ............ 257/781; 257/713; 257/E23.023
(58) Field of Classification Search .......... 257/781, 257/713, E23.023
See application file for complete search history.

(56) References Cited

U.S. PATENT DOCUMENTS

| | | | |
|---|---|---|---|
| 6,034,440 A * | 3/2000 | Ball | 257/786 |
| 6,500,760 B1 * | 12/2002 | Peterson et al. | 438/684 |
| 7,132,738 B2 * | 11/2006 | Tomimatsu | 257/686 |
| 2005/0200015 A1 | 9/2005 | Obiya | |
| 2006/0012016 A1 | 1/2006 | Betz | |

FOREIGN PATENT DOCUMENTS

| | | |
|---|---|---|
| JP | 2001237263 A | 8/2001 |
| JP | 2003303845 A | 10/2003 |
| WO | 2006/018671 A1 | 2/2006 |

OTHER PUBLICATIONS

Harman, George G., "Wire Bonding in Microelectronics Materials, Processes, Reliability, and Yield 2ed", 1997, McGraw-Hill, USA, XP-002539702, ISBN 0-07-032619-3, pp. 30-32.

* cited by examiner

*Primary Examiner* — Benjamin P Sandvik
*Assistant Examiner* — Krista Soderholm
(74) *Attorney, Agent, or Firm* — Langlotz Patent Works, Inc.; Thomas F. Lenihan

(57) ABSTRACT

A ball-bump bonded ribbon-wire interconnect has a ball-bump attached to an integrated circuit's bond pad. A ribbon-wire has one end attached to the ball-bump and its opposing end attached to a substrate's metallized surface. The ribbon-wire may be wider than the ball-bump, and the ball-bump may separate the ribbon-wire from the integrated circuit's surface. The ribbon-wire may interconnect multiple integrated circuits, each of which has a ball-bump or a suitably wide metallized surface, to a substrate's metallized surface. The present invention also includes a method of electrically connecting an electronic component to a substrate.

27 Claims, 2 Drawing Sheets

BALL-BUMP BONDED RIBBON-WIRE INTERCONNECT

FIELD OF THE INVENTION

The present invention relates to a ball-bump bonded ribbon-wire interconnect for use in connection with integrated circuits and discrete electronic components. The ball-bump bonded ribbon-wire interconnect has particular utility in connection with enabling a ribbon-wire to be bonded to an integrated circuit's bond pad that is narrower than the ribbon-wire.

BACKGROUND OF THE INVENTION

Ball-bump bonded ribbon-wire interconnects are desirable for enabling a ribbon-wire to be bonded to an integrated circuit's bond pad that is narrower than the ribbon-wire. Ribbon-wire is used when a wide signal path is desirable to limit signal loss of a high-frequency signal or avoid other adverse performance effects. Thermo-sonic wire bonding equipment exists that can place ribbon-wire interconnects, but existing techniques are limited because they require bond pads that are of equal or larger size than the ribbon-wire's width. The ribbon-wire is captured between the bond tool's foot and the pad in order to apply ultrasonic energy and force to form the bond between the ribbon-wire and the bond pad's metallization. The resulting bond establishes an electrical connection between the ribbon-wire and the bond pad's metallization.

Therefore, the bond tool must be able to touch down on each land to form the bond, and the contact area for each bond pad must be of the same size or larger than the bond tool to properly form a bond. The problem with using the wide ribbon-wire on a narrower bond pad is that the contact areas are not the same. With a given amount of energy delivered to a smaller area when there is a smaller bond pad, adverse results can occur, including failure of the bond due to excessive energy concentration. Therefore, the combination of ultrasonic energy, force, and time must be controlled to limit the energy transferred into the bond in this circumstance.

Furthermore, the bond pads are typically on the same surface as the integrated circuit itself or can even be recessed, which prevents the bond tool from reaching a pad without first making potentially damaging contact with the surface of the integrated circuit. Additionally, the ribbon-wire is opaque, which makes it impossible to visually locate the bond pad through the ribbon-wire to determine when the bonding tool is properly positioned to create a bond.

The use of wire-mesh interconnects is known in the prior art. Wire mesh is used in the form of a ribbon or strip. However, hand cut pieces of gold wire-mesh are needed and have been placed manually to connect the gold wire-mesh to a bond pad having a width that is less than that of the wire-mesh. Wire-mesh enables the bond location to be viewed through the wire-mesh, which facilitates the manual alignment to a bond pad in a manner that is not possible with opaque ribbon-wire. However, this existing method requires extensive manual effort to create multiple bonds on intersections of the wire-mesh for each interconnect placed. Furthermore, when wire-mesh is bonded to a narrower bond pad, the overhanging mesh in some cases must be folded up to avoid short circuits, requiring additional manual effort.

Therefore, a need exists for a new and improved ball-bump bonded ribbon-wire interconnect that can be used for enabling a ribbon-wire to be bonded to an integrated circuit's bond pad that is narrower than the ribbon-wire. In this regard, the various embodiments of the present invention substantially fulfill at least some of these needs. In this respect, the ball-bump bonded ribbon-wire interconnect according to the present invention substantially departs from the conventional concepts and designs of the prior art, and in doing so provides an apparatus primarily developed for the purpose of enabling a ribbon-wire to be bonded to an integrated circuit's bond pad that is narrower than the ribbon-wire.

SUMMARY OF THE INVENTION

The present invention provides an improved ball-bump bonded ribbon-wire interconnect, and overcomes the above-mentioned disadvantages and drawbacks of the prior art. As such, the general purpose of the present invention, which will be described subsequently in greater detail, is to provide an improved ball-bump bonded ribbon-wire interconnect that has all the advantages over the prior art mentioned above.

To attain this, the preferred embodiment of the present invention essentially comprises a ball-bump attached to an integrated circuit's bond pad. A ribbon-wire has one end attached to the ball-bump and its opposing end attached to a substrate's metallized surface. The ribbon-wire may be wider than the ball-bump, and the ball-bump may separate the ribbon-wire from the integrated circuit's surface. The ribbon-wire may interconnect multiple integrated circuits, each of which has a ball-bump or a suitably wide metallized surface, to a substrate's metallized surface. The present invention also includes a method of electrically connecting an electronic component to a substrate. There are, of course, additional features of the invention that will be described hereinafter and which will form the subject matter of the claims attached.

There has thus been outlined, rather broadly, the more important features of the invention in order that the detailed description thereof that follows may be better understood and in order that the present contribution to the art may be better appreciated.

BRIEF DESCRIPTION OF THE DRAWINGS

The same reference numerals refer to the same parts throughout the various figures.

DESCRIPTION OF THE CURRENT EMBODIMENT

Figure 1:
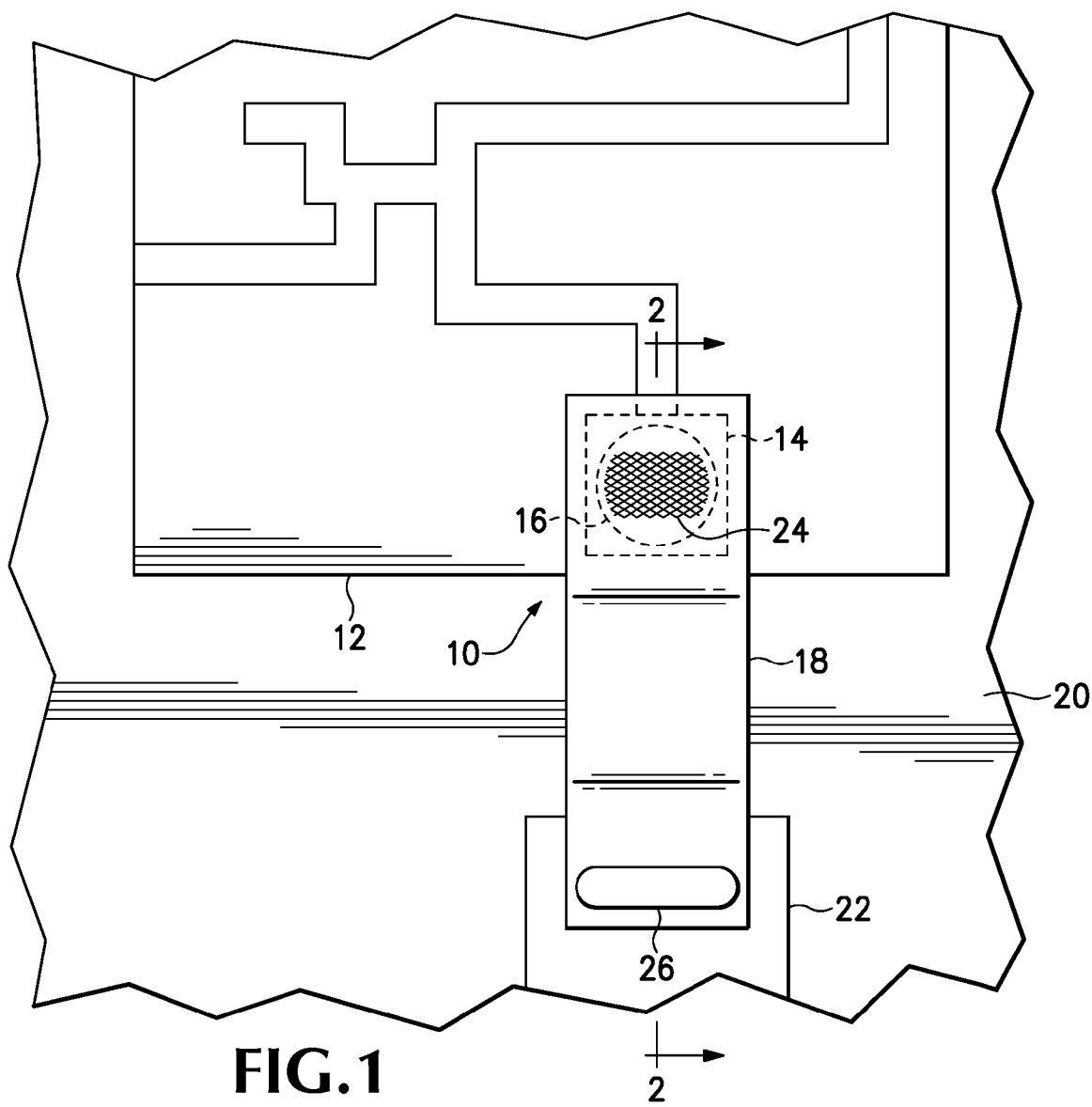
FIG. 1 is a top view of the current embodiment of the ball-bump bonded ribbon-wire interconnect constructed in accordance with the principles of the present invention.

A preferred embodiment of the ball-bump bonded ribbon-wire interconnect of the present invention is shown and generally designated by the reference numeral 10.

Figure 2:
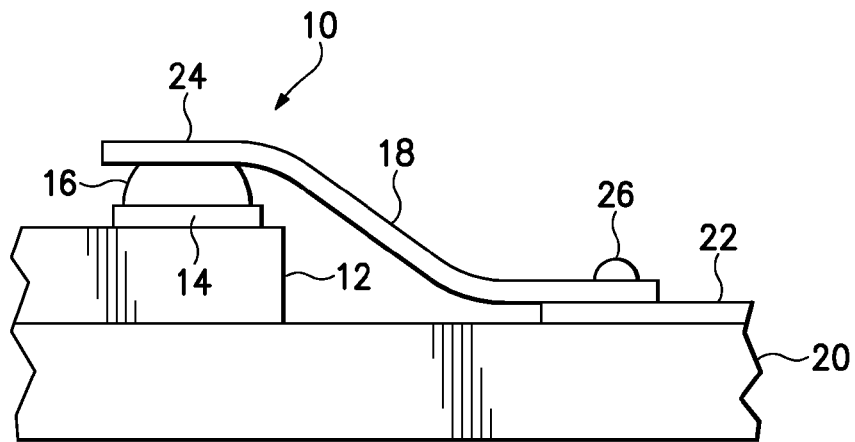
FIG. 2 is a side sectional view of the current embodiment of the ball-bump bonded ribbon-wire interconnect of the present invention.

FIGS. 1 and 2 illustrate improved ball-bump bonded ribbon-wire interconnect 10 of the present invention. More particularly, the ball-bump bonded ribbon-wire interconnect 10 depicts a ribbon-wire interconnect 18 connecting an integrated circuit 12 to a substrate 20. A gold ball-bump 16 placed on the integrated circuit 12's bond pad 14, which is narrower than the ribbon-wire, to raise the surface of the bond pad 14. This enables a ribbon-bond tool to contact the ball-bump 16 to form the ball-bump bond 24 by partially flattening the ball-bump 16 as is depicted in FIG. 2.

The portion of the ribbon-wire extending beyond the ball-bump 16 does not cause electrical problems such as shorts to neighboring ground pads and high parasitic capacitance because it is substantially parallel to, and spaced apart from, the surface of the integrated circuit 12. The ribbon-wire interconnect 18 can then be terminated at a surface bond 26 in the normal manner on the metallized surface 22 of substrate 20. The metallized surface 22 of substrate 20 is at least as wide as the ribbon-wire. At the surface bond 26, the ribbon-wire is securely bonded across its full width and deformed sufficiently so it can be separated from the interconnected ribbon-wire 18 by tearing. In the current embodiment, it is preferable for the integrated circuit 12 to be at the same level or higher than the substrate 20 to avoid clearance issues with the ribbon-bonding tool. The upper surface of the integrated circuit 12 may also be slightly below the adjacent substrate bonding surface, as long as the bonding tool can reach the integrated circuit's surface without interference from the substrate's surface. However, this should not be viewed as limiting because equipment is available with wire cutters and advances in ribbon-bonding tool technology may eliminate this constraint in the future.

Figure 3:
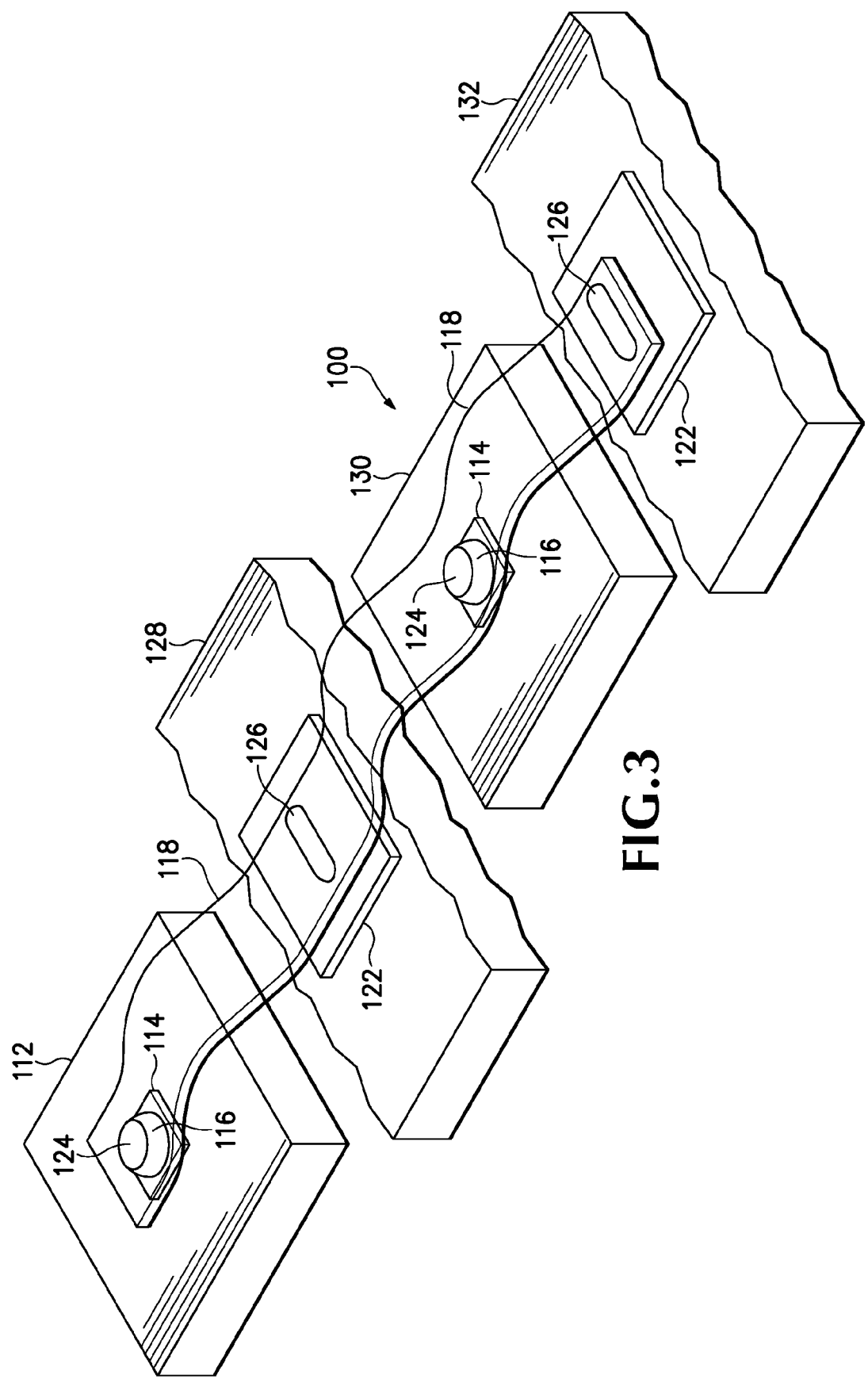
FIG. 3 is a top perspective view of an alternative embodiment of the ball-bump bonded ribbon-wire interconnect of the present invention. The ribbon-wire is translucent for the purposes of illustration.

FIG. 3 illustrates an alternative embodiment of the improved ball-bump bonded ribbon-wire interconnect 100 of the present invention. More particularly, the alternative embodiment of the ball-bump bonded ribbon-wire interconnect 100 depicts a ribbon-wire interconnect 118 connecting multiple integrated circuits using a combination of ball-bump bonds 124 and surface bonds 126. The ribbon-wire interconnect 118 is connected to first integrated circuit 112 by a ball-bump bond 124, first substrate 128 by a surface bond 126, second integrated circuit 130 by a ball-bump bond 124, and second substrate 132 by a surface bond 126. Any combination of ball-bump bonds and surface bonds can be used as the first bond or the intermediate bonds so long as the final bond is either a surface bond or is performed on a bond pad large enough to contact the full width of the bond tool-foot to terminate the ribbon-wire interconnect 118. However, this should not be viewed as limiting because advances in ribbon-bonding tool technology may eliminate this constraint in the future.

To connect an electronic component to a substrate by a ball-bump bonded ribbon-wire interconnect, a wire ball-bonding machine places ball-bumps on each of a workpiece's bond pads where bonds of the type disclosed are to be made (such as those that are narrower than a ribbon-wire to be employed.) The ball bumps have upper portions above the level of the integrated circuit that is part of the workpiece.

After ball-bump placement, the workpiece is moved to a ribbon-bonding machine or workstation. There, a bonding tool thermo-sonically welds a free end of the ribbon-wire to a first location using wedge bonding. The first location may be on a ball-bump or a metallized surface or bond pad that is as wide as or wider than the ribbon-wire. The ribbon-bonding tool then bonds the ribbon-wire to additional locations if required, which may be any combination of ball-bumps or metallized surfaces or bond pads that are as wide as or wider than the ribbon-wire, prior to terminating the ribbon-wire interconnect at a metallized surface or bond pad that is as wide as or wider than the ribbon-wire. In the event a bond pad has multiple ball-bumps that are either adjacent or separated by a distance that is less than the ribbon-wire's width, the ribbon-wire could be thermo-sonically welded to all of the proximate ball bumps simultaneously. Although it is generally viewed as being inefficient to use separate passes by two different machines, the present invention provides a tremendous improvement in efficiency compared to known manual methods, which have heretofore resisted automation.

While current embodiments of the ball-bump bonded ribbon-wire interconnect have been described in detail, it should be apparent that modifications and variations thereto are possible, all of which fall within the true spirit and scope of the invention. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. For example, any suitably electrically conductive and corrosion resistant material could be used instead of the gold ball-bumps. Furthermore, although ball-bump placement by a wire ball-bonding machine has been described, ball-bump placement could be performed by alternative methods. In addition, ultrasonic compression bonding, which applies ultrasonic energy with force over time without heating the workpiece, may be used instead of the thermo-sonic welding described. And although enabling a ribbon-wire to be bonded to an integrated circuit's bond pad that is narrower than the ribbon-wire has been described, it should be appreciated that the ball-bump bonded ribbon-wire interconnect herein described is also suitable for use on discrete components such as diodes, transistors, and attenuators. Furthermore, wire-mesh could be used instead of the ribbon-wire.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A ball-bump bonded ribbon-wire interconnect comprising:
    a first electronic component connected to a substrate;
    the first electronic component having an upper surface including a bond pad;
    the substrate including a second electrical contact other than the bond pad;
    a ball-bump having a bump width;
    the ball-bump being attached to the bond pad;
    a ribbon-wire having a ribbon width greater than the bump width;
    a first portion of the ribbon-wire being attached to the ball-bump; and
    a second portion of the ribbon-wire being attached to the second electrical contact.

2. The ball-bump bonded ribbon-wire interconnect as defined in claim 1, wherein the ribbon-wire has opposed ends and the first portion is a first end of the ribbon-wire.

3. The ball-bump bonded ribbon-wire interconnect as defined in claim 1, wherein the second electrical contact is a metalized contact on a surface of the substrate.

4. The ball-bump bonded ribbon-wire interconnect as defined in claim 3, wherein the ribbon-wire is thermo-sonically welded to the metalized contact.

5. The ball-bump bonded ribbon-wire interconnect as defined in claim 1, wherein the second electrical contact is a bond pad of a second electronic component attached to the substrate.

6. The ball-bump bonded ribbon-wire interconnect as defined in claim 5, wherein the ribbon-wire is thermo-sonically welded to the bond pad.

7. A ball-bump bonded ribbon-wire interconnect comprising:
- a first electronic component connected to a substrate;
- the first electronic component having an upper surface including a bond pad;
- the substrate including a second electrical contact other than the bond pad;
- a ball-bump having a bump width;
- the ball-bump being attached to the bond pad;
- a ribbon-wire having a ribbon width;
- a first portion of the ribbon-wire being attached to the ball-bump; and
- a second portion of the ribbon-wire being attached to the second electrical contact;

wherein, the second electrical contact includes a ball-bump to which the ribbon-wire is connected.

8. The ball-bump bonded ribbon-wire interconnect as defined in claim 7, wherein the ribbon-wire is thermo-sonically welded to the second electrical contact's ball-bump.

9. The ball-bump bonded ribbon-wire interconnect as defined in claim 1, wherein the ball-bump has an upper portion extending above the first electronic component's upper surface.

10. The ball-bump bonded ribbon-wire interconnect as defined in claim 1, wherein the ball-bump has an upper portion extending above the bond pad.

11. The ball-bump bonded ribbon-wire interconnect as defined in claim 1, wherein the ribbon-wire is separated from the first electronic component's upper surface by the ball-bump.

12. The ball-bump bonded ribbon-wire interconnect as defined in claim 1, wherein the ribbon-wire is thermo-sonically welded to the ball-bump.

13. A ball-bump bonded ribbon-wire interconnect comprising:
- a first electronic component connected to a substrate having a metalized surface portion;
- the first electronic component having an upper surface including a bond pad;
- a ball-bump having a bump width, the ball-bump being attached to the first electronic component's bond pad;
- a ribbon-wire having a ribbon width;
- the ribbon-wire having opposed ends;
- the ribbon-wire having a middle;
- one of the opposed ends being attached to the first electronic component's ball-bump;
- a second electronic component connected to the substrate having a metalized surface portion;
- the second electronic component having an upper surface including a bond pad;
- the middle of the ribbon-wire being attached to the second electronic component's ball-bump; and
- another of the opposed ends of the ribbon-wire being attached to the metalized surface portion.

14. The ball-bump bonded ribbon-wire interconnect as defined in claim 13, wherein the ball-bumps have an upper portion extending above the electronic components' upper surfaces.

15. The ball-bump bonded ribbon-wire interconnect as defined in claim 13, wherein the ribbon width is wider than the bump width.

16. The ball-bump bonded ribbon-wire interconnect as defined in claim 13, wherein the ball-bumps extend above the bond pads.

17. The ball-bump bonded ribbon-wire interconnect as defined in claim 13, wherein the ribbon-wire is separated from the electronic components' upper surfaces by the ball-bumps.

18. The ball-bump bonded ribbon-wire interconnect as defined in claim 13, wherein the ribbon-wire is thermo-sonically welded to the ball-bumps.

19. The ball-bump bonded ribbon-wire interconnect as defined in claim 13, wherein the ribbon-wire is thermo-sonically welded to the metalized surface.

20. A method of electrically connecting an electronic component to a substrate comprising the steps:
- providing a ribbon-wire having a free end and a second portion, a substrate having a metalized surface portion; the electronic component being connected to the substrate and having an upper surface including a bond pad;
- attaching a ball-bump to the bond pad;
- attaching the free end of the ribbon-wire to the ball-bump, the ribbon-wire being wider than the ball-bump; and
- attaching a second portion of the ribbon-wire to the metalized surface portion.

21. The method of electrically connecting an electronic component to a substrate as defined in claim 20, wherein the ball-bump is attached to the bond pad by a wire ball-bonding facility.

22. The method of electrically connecting an electronic component to a substrate as defined in claim 20, wherein the ribbon-wire is attached to the ball-bump and to the metalized surface by a ribbon-wire bonding facility.

23. The method of electrically connecting an electronic component to a substrate as defined in claim 22, further comprising the step of separating the ribbon-wire adjacent to the second portion using the ribbon-wire bonding facility from the second portion.

24. The method of electrically connecting an electronic component to a substrate as defined in claim 20, wherein the ball-bump has an upper portion extending above the electronic component's upper surface.

25. The method of electrically connecting an electronic component to a substrate as define in claim 20, wherein the ball-bump has an upper portion extending above the bond pad.

26. The method of electrically connecting an electronic component to a substrate as defined in claim 20, wherein the ribbon-wire is separated from the electronic component's upper surface by the ball-bump.

27. The method of electrically connecting an electronic component to a substrate as defined in claim 20, wherein the ribbon-wire is thermo-sonically welded to the ball-bump and to the metalized surface.

* * * * *